(12) United States Patent
Kizilyalli et al.

(10) Patent No.: US 8,669,467 B2
(45) Date of Patent: *Mar. 11, 2014

(54) THIN ABSORBER LAYER OF A PHOTOVOLTAIC DEVICE

(75) Inventors: Isik C. Kizilyalli, San Francisco, CA (US); Melissa J. Archer, Mountain View, CA (US); Harry Atwater, South Pasadena, CA (US); Thomas J. Gmitter, Sunnyvale, CA (US); Gang He, Cupertino, CA (US); Andreas G. Hegedus, Burlingame, CA (US); Gregg Higashi, San Jose, CA (US)

(73) Assignee: Alta Devices, Inc., Sunnyvale, CA (US)

( * ) Notice: Subject to any disclaimer, the term of this patent is extended or adjusted under 35 U.S.C. 154(b) by 180 days.

This patent is subject to a terminal disclaimer.

(21) Appl. No.: 12/940,918

(22) Filed: Nov. 5, 2010

(65) Prior Publication Data

US 2011/0041904 A1  Feb. 24, 2011

Related U.S. Application Data

(62) Division of application No. 12/605,129, filed on Oct. 23, 2009.

(60) Provisional application No. 61/107,959, filed on Oct. 23, 2008.

(51) Int. Cl.
*H01L 31/00* (2006.01)

(52) U.S. Cl.
USPC .......................................................... 136/262

(58) Field of Classification Search
USPC ......... 136/243, 244, 245, 246, 247, 248, 249, 136/250, 251, 252, 253, 354, 356, 257, 258, 136/259, 260, 261, 262, 263, 264, 265
See application file for complete search history.

(56) References Cited

U.S. PATENT DOCUMENTS

| 4,017,332 A | 4/1977 | James |
| 4,107,723 A | 8/1978 | Kamath |

(Continued)

FOREIGN PATENT DOCUMENTS

| EP | 0595634 A1 | 5/1994 |
| JP | 06-244443 | 9/1994 |

(Continued)

OTHER PUBLICATIONS

Peter A. Lewis, "Pigment Handbook vol. I: Properties and Economics, 2nd Edition", John Wiley & Sons, New York, pp. 790-791 (1988).

(Continued)

*Primary Examiner* — Alexander Kollias
(74) *Attorney, Agent, or Firm* — Sawyer Law Group, P.C.

(57) ABSTRACT

Methods and apparatus are provided for converting electromagnetic radiation, such as solar energy, into electric energy with increased efficiency when compared to conventional solar cells. In one embodiment of a photovoltaic (PV) device, the PV device generally includes an n-doped layer and a $p^+$-doped layer adjacent to the n-doped layer to form a p-n layer such that electric energy is created when electromagnetic radiation is absorbed by the p-n layer. The n-doped layer and the $p^+$-doped layer may compose an absorber layer having a thickness less than 500 nm. Such a thin absorber layer may allow for greater efficiency and flexibility in PV devices when compared to conventional solar cells.

7 Claims, 6 Drawing Sheets

(56) References Cited

U.S. PATENT DOCUMENTS

| | | | |
|---|---|---|---|
| 4,191,593 A | 3/1980 | Cacheux | |
| 4,197,141 A | 4/1980 | Bozler et al. | |
| 4,295,002 A | 10/1981 | Chappell et al. | |
| 4,338,480 A | 7/1982 | Antypas et al. | |
| 4,385,198 A | 5/1983 | Rahilly | |
| 4,400,221 A * | 8/1983 | Rahilly | 438/74 |
| 4,410,758 A | 10/1983 | Grolitzer | |
| 4,419,533 A | 12/1983 | Czubatyj et al. | |
| 4,444,992 A | 4/1984 | Cox, III | |
| 4,479,027 A | 10/1984 | Todorof | |
| 4,497,974 A | 2/1985 | Deckman et al. | |
| 4,633,030 A | 12/1986 | Cook | |
| 4,667,059 A | 5/1987 | Olson | |
| 4,889,656 A | 12/1989 | Flynn et al. | |
| 4,916,503 A | 4/1990 | Uematsu et al. | |
| 4,989,059 A * | 1/1991 | Micheels et al. | 257/446 |
| 4,997,491 A | 3/1991 | Hokuyo et al. | |
| 5,116,427 A | 5/1992 | Fan et al. | |
| 5,217,539 A | 6/1993 | Fraas et al. | |
| 5,223,043 A | 6/1993 | Olson et al. | |
| 5,316,593 A | 5/1994 | Olson et al. | |
| 5,330,585 A | 7/1994 | Chang et al. | |
| 5,342,453 A | 8/1994 | Olson | |
| 5,376,185 A | 12/1994 | Wanlass | |
| 5,385,960 A | 1/1995 | Emmons et al. | |
| 6,107,563 A | 8/2000 | Nakanishi et al. | |
| 6,166,218 A | 12/2000 | Ravichandran et al. | |
| 6,166,318 A * | 12/2000 | Freeouf | 136/249 |
| 6,229,084 B1 | 5/2001 | Katsu | |
| 6,231,931 B1 | 5/2001 | Blazey et al. | |
| 6,255,580 B1 | 7/2001 | Karam et al. | |
| 6,372,981 B1 | 4/2002 | Ueda et al. | |
| 6,617,508 B2 | 9/2003 | Kilmer et al. | |
| 2001/0027805 A1 | 10/2001 | Ho et al. | |
| 2002/0053683 A1 | 5/2002 | Hill et al. | |
| 2002/0144724 A1 | 10/2002 | Kilmer et al. | |
| 2002/0179141 A1 | 12/2002 | Ho et al. | |
| 2003/0070707 A1 | 4/2003 | King et al. | |
| 2003/0140962 A1 | 7/2003 | Sharps et al. | |
| 2003/0222278 A1 | 12/2003 | Liu et al. | |
| 2006/0081963 A1 | 4/2006 | Rehder et al. | |
| 2006/0144435 A1 | 7/2006 | Wanlass | |
| 2006/0162767 A1 | 7/2006 | Mascarenhas et al. | |
| 2006/0207651 A1 | 9/2006 | Posthuma et al. | |
| 2006/0255340 A1 | 11/2006 | Manivannan et al. | |
| 2007/0137695 A1 | 6/2007 | Fetzer et al. | |
| 2007/0137698 A1 | 6/2007 | Wanlass et al. | |
| 2007/0277874 A1 | 12/2007 | Dawson-Elli et al. | |
| 2008/0245409 A1 | 10/2008 | Varghese et al. | |
| 2009/0283802 A1 | 11/2009 | Henderson et al. | |
| 2010/0006143 A1 | 1/2010 | Welser | |
| 2010/0096010 A1 | 4/2010 | Welser | |
| 2010/0126552 A1 | 5/2010 | Kizilyalli et al. | |
| 2010/0126570 A1 | 5/2010 | Kizilyalli et al. | |
| 2010/0126571 A1 | 5/2010 | Kizilyalli et al. | |
| 2010/0126572 A1 | 5/2010 | Kizilyalli et al. | |
| 2010/0132774 A1 | 6/2010 | Borden | |
| 2010/0132780 A1 | 6/2010 | Kizilyalli et al. | |
| 2012/0031478 A1 | 2/2012 | Boisvert et al. | |

FOREIGN PATENT DOCUMENTS

| | | |
|---|---|---|
| JP | 07-007148 | 1/1995 |
| KR | 10-0762772 | 10/2007 |
| WO | WO 02065553 A1 | 8/2002 |

OTHER PUBLICATIONS

M. M. Sanfacon et al, "Analysis of AlGaAs/GaAs Solar Cell Structures by Optical Reflectance Spectroscopy" IEEE Transactions on Electron Devices, vol. 37, No. 2, Feb. 1990, pp. 450-454.

Q. M. Zhang et al., "Effects of Displaced p-n Junction of Heterojunction Bipolar Transistors", IEEE Transactions on Electron Devices, vol. 39, No. 11, Nov. 1992, pp. 2430-2437.

* cited by examiner

THIN ABSORBER LAYER OF A PHOTOVOLTAIC DEVICE

CROSS-REFERENCE TO RELATED APPLICATIONS

Under 35 U.S.C. §120, this application is a divisional application and claims the benefit of priority to U.S. patent application Ser. No. 12/605,129, filed Oct. 23, 2009 and U.S. Provisional Patent Application Ser. No. 61/107,959, filed Oct. 23, 2008, all of which is incorporated herein by reference.

BACKGROUND

1. Technical Field

Embodiments of the present invention generally relate to photovoltaic (PV) devices, such as solar cells, with increased efficiency and greater flexibility and methods for fabricating the same.

2. Description of the Related Art

As fossil fuels are being depleted at ever-increasing rates, the need for alternative energy sources is becoming more and more apparent. Energy derived from wind, from the sun, and from flowing water offer renewable, environment-friendly alternatives to fossil fuels, such as coal, oil, and natural gas. Being readily available almost anywhere on Earth, solar energy may someday be a viable alternative.

To harness energy from the sun, the junction of a solar cell absorbs photons to produce electron-hole pairs, which are separated by the internal electric field of the junction to generate a voltage, thereby converting light energy to electric energy. The generated voltage can be increased by connecting solar cells in series, and the current may be increased by connecting solar cells in parallel. Solar cells may be grouped together on solar panels. An inverter may be coupled to several solar panels to convert DC power to AC power Nevertheless, the currently high cost of producing solar cells relative to the low efficiency levels of contemporary devices is preventing solar cells from becoming a mainstream energy source and limiting the applications to which solar cells may be suited. Accordingly, there is a need for more efficient photovoltaic devices suitable for a myriad of applications.

SUMMARY OF THE INVENTION

Embodiments of the present invention generally relate to methods and apparatus for converting electromagnetic radiation, such as solar energy, into electric energy with increased efficiency when compared to conventional solar cells One embodiment of the present invention provides a photovoltaic (PV) device. The PV device generally includes an n-doped layer and a p$^+$-doped layer adjacent to the n-doped layer to form a p-n layer such that electric energy is created when electromagnetic radiation is absorbed by the p-n layer.

Another embodiment of the present invention is a method of fabricating a PV device. The method generally includes forming an n-doped layer above a substrate and forming a p$^+$-doped layer above the n-doped layer to create a p-n layer between the n-doped layer and the p$^+$-doped layer such that electric energy is created when electromagnetic radiation is absorbed by the p-n layer.

BRIEF DESCRIPTION OF THE DRAWINGS

So that the manner in which the above-recited features of the invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Embodiments of the present invention provide techniques and apparatus for converting electromagnetic radiation, such as solar energy, into electric energy with increased efficiency when compared to conventional solar cells.

An Exemplary Thin Absorber Layer

Figure 1:
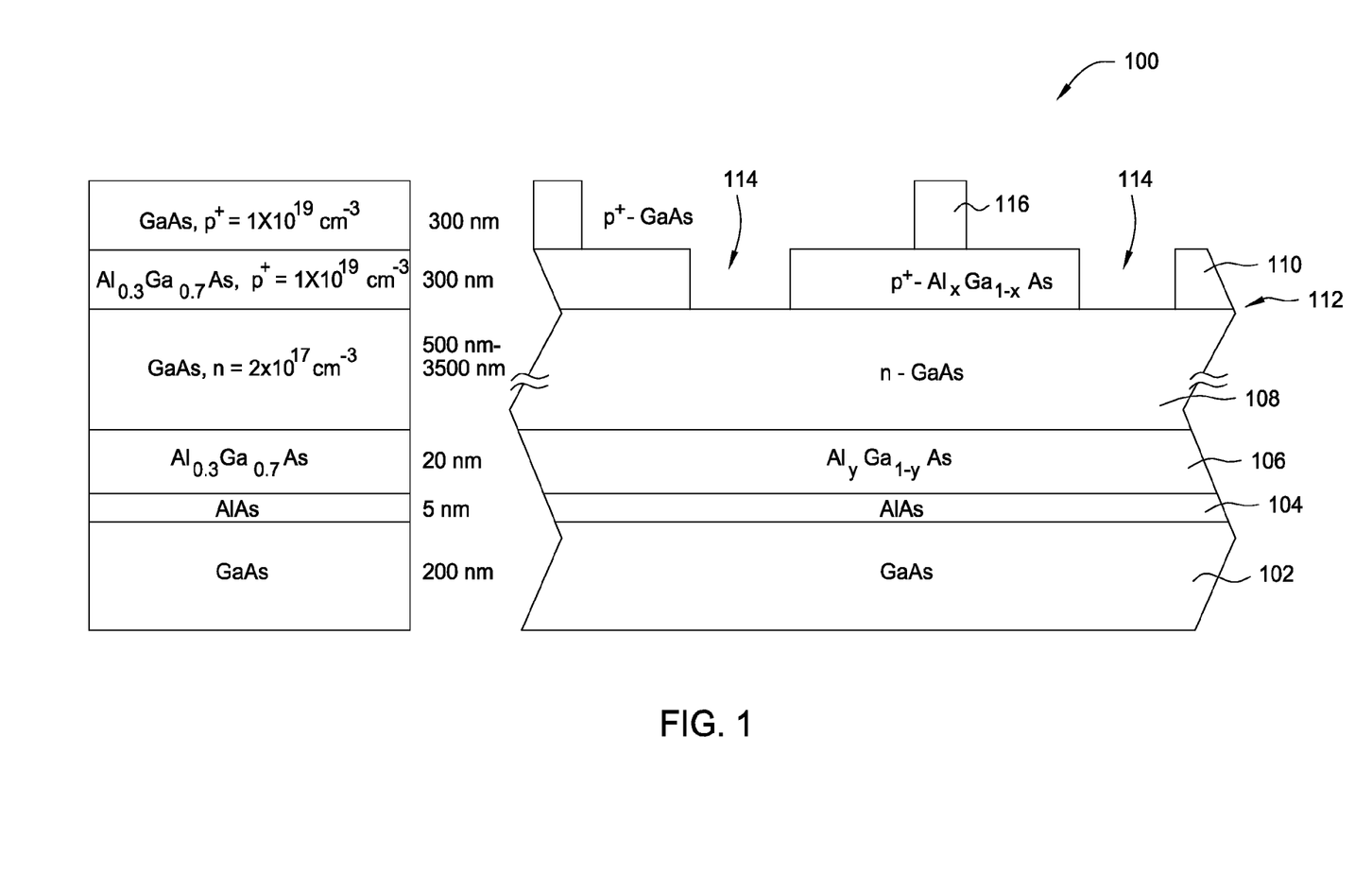
FIG. 1 illustrates multiple epitaxial layers for a photovoltaic (PV) unit in cross-section with example thickness, composition, and doping of the semiconductor layers, in accordance with an embodiment of the present invention.

FIG. 1 illustrates various epitaxial layers of a photovoltaic (PV) unit 100 in cross-section during fabrication. The various layers may be formed using any suitable method for semiconductor growth, such as molecular beam epitaxy (MBE) or metalorganic chemical vapor deposition (MOCVD), on a substrate (not shown).

To form the PV unit 100, one or more buffer layers may be formed on the substrate. The purpose of the buffer layer(s) is to provide an intermediary between the substrate and the semiconductor layers of the final PV unit that can accommodate their different crystallographic structures as the various epitaxial layers are formed. Having a thickness of about 200 nm, for example, a buffer layer 102 may comprise a group III-V compound semiconductor, such as gallium arsenide (GaAs), depending on the desired composition of the final PV unit. For some embodiments, for example, the substrate may comprise GaAs when creating a GaAs buffer layer.

For some embodiments, a release layer 104 may be formed above the buffer layer 102. The release layer 104 may comprise aluminum arsenide (AlAs), for example, and have a thickness in a range from about 5 to 10 nm. The purpose of the thin release layer 104 is described in greater detail below.

Above the release layer 104, a window layer 106 may be formed. The window layer 106 may comprise aluminum gallium arsenide (AlGaAs), such as $Al_{0.3}Ga_{0.7}As$. The window layer 106 may have a thickness in a range of about 5 to 30 nm (e.g., 20 nm as shown) and may be undoped. The window layer 106 may be transparent to allow photons to pass through the window layer on the front side of the PV unit to other underlying layers.

A base layer 108 may be formed above the window layer 106. The base layer 108 may comprise any suitable group III-V compound semiconductor, such as GaAs. The base layer 108 may be monocrystalline. The base layer 108 may be n-doped, and for some embodiments, the doping concentration of the n-doped base layer 108 may be in a range from about $1\times10^{16}$ to $1\times10^{19}$ cm$^{-3}$ (e.g., $2\times10^{17}$ cm$^{-3}$ as shown). The thickness of the base layer 108 may be in a range from about 300 to 3500 nm.

As illustrated in FIG. 1, an emitter layer 110 may be formed above the base layer 108. The emitter layer 110 may comprise any suitable group III-V compound semiconductor for forming a heterojunction with the base layer 108. For example, if the base layer 108 comprises GaAs, the emitter layer 110 may comprise a different semiconductor material, such as AlGaAs. If the emitter layer 110 and the window layer 106 both comprise AlGaAs, the $Al_xGa_{1-x}As$ composition of the emitter layer 110 may be the same as or different than the $Al_yGa_{1-y}As$ composition of the window layer 106. The emitter layer 110 may be monocrystalline. The emitter layer 110 may be heavily p-doped (i.e., p$^+$-doped), and for some embodiments, the doping concentration of the p$_+$-doped emitter layer may be in a range from about $1\times10^{17}$ to $1\times10^{20}$ cm$^{-3}$ (e.g., $1\times10^{19}$ cm$^{-3}$ as shown). The thickness of the emitter layer 110 may be about 300 nm, for example. The combination of the base layer 108 and the emitter layer 110 may form an absorber layer for absorbing photons. For some embodiments, the absorber layer may have a thickness less than 800 nm, or even less than 500 nm.

The contact of an n-doped base layer to a p$^+$-doped emitter layer creates a p-n layer 112. When light is absorbed near the p-n layer 112 to produce electron-hole pairs, the built-in electric field may force the holes to the p$^+$-doped side and the electrons to the n-doped side. This displacement of free charges results in a voltage difference between the two layers 108, 110 such that electron current may flow when a load is connected across terminals coupled to these layers.

Rather than an n-doped base layer 108 and a p$^+$-doped emitter layer 110 as described above, conventional photovoltaic semiconductor devices typically have a p-doped base layer and an n$^+$-doped emitter layer. The base layer is typically p-doped in conventional devices due to the diffusion length of the carriers. Fabricating a thinner base layer according to embodiments of the invention allows for the change to an n-doped base layer. The higher mobility of electrons in an n-doped layer compared to the mobility of holes in a p-doped layer leads to the lower doping density in the n-doped base layer 108 of embodiments of the invention.

Once the emitter layer 110 has been formed, cavities or recesses 114 may be formed in the emitter layer deep enough to reach the underlying base layer 108. Such recesses 114 may be formed by applying a mask to the emitter layer 110 using photolithography, for example, and removing the semiconductor material in the emitter layer 110 not covered by the mask using any suitable technique, such as wet or dry etching. In this manner, the base layer 108 may be accessed via the back side of the PV unit 100.

For some embodiments, an interface layer 116 may be formed above the emitter layer 110. The interface layer 116 may comprise any suitable group III-V compound semiconductor, such as GaAs. The interface layer 116 may be p$^+$-doped, and for some embodiments, the doping concentration of the p$^+$-doped interface layer 116 may be $1\times10^{19}$ cm$^{-3}$. The thickness of the interface layer 116 may be about 300 nm, for example.

Once the remaining epitaxial layers have been formed above the release layer 104, the thin release layer 104 may be sacrificed via etching with aqueous HF, for example. In this manner, the functional layers of the PV unit 100 (e.g., the window layer 106, the base layer 108, and the emitter layer 110) may be separated from the buffer layer(s) 102 and substrate during the epitaxial lift-off (ELO) process.

A PV unit created in this manner has a significantly thin absorber layer (e.g., <500 nm) compared to conventional solar units, which may be several micrometers thick. The thickness of the absorber layer is proportional to dark current levels in the PV unit (i.e., the thinner the absorber layer, the lower the dark current). Dark current is the small electric current that flows through the PV unit or other similar photosensitive device (e.g., a photodiode) even when no photons are entering the device. This background current may be present as the result of thermionic emission or other effects. Because the open circuit voltage ($V_{oc}$) increases as the dark current is decreased in a photosensitive semiconductor device, a thinner absorber layer may most likely lead to a greater $V_{oc}$ for a given light intensity and, thus, increased efficiency. As long as the absorber layer is able to trap light, the efficiency increases as the thickness of the absorber layer is decreased.

The thinness of the absorber layer may not only be limited by the capabilities of thin film technology and ELO. For example, efficiency increases with the thinness of the absorber layer, but the absorber layer should be thick enough to carry current. However, higher doping levels may allow current to flow, even in very thin absorber layers. Therefore, increased doping may be utilized to fabricate very thin absorber layers with even greater efficiency. Conventional PV devices may suffer from volume recombination effects, and therefore, such conventional devices do not employ high doping in the absorber layer. The sheet resistance of the absorber layer may also be taken into consideration when determining the appropriate thickness.

Not only does a thin absorber layer lead to increased efficiency, but PV units with such a thin absorber layer may be more flexible than conventional solar cells having a thickness of several micrometers. Therefore, PV units according to embodiments of the invention may be appropriate for a greater number of applications than conventional solar cells.

Figure 2A:
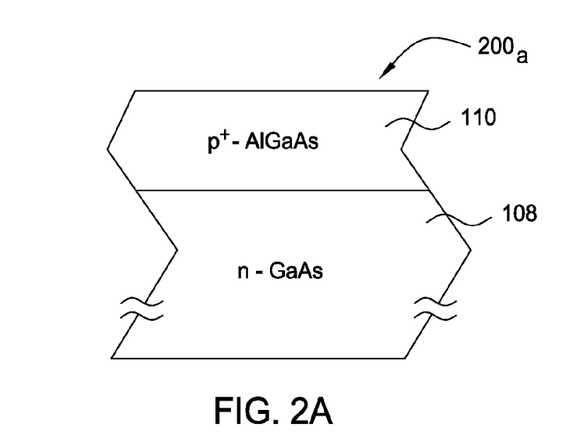
FIGS. 2A-D illustrate various layer stack profiles for the base and emitter layers of the PV unit, in accordance with embodiments of the present invention.

FIGS. 2A-D illustrate various layer stack profiles $200_{a-d}$ for the base and emitter layers 108, 110 of the PV unit, in accordance with embodiments of the present invention. The layer stack profile $200_a$ in FIG. 2A illustrates the base and emitter layers 108, 110 as illustrated in FIG. 1. For some embodiments, an intermediate layer 202 may be formed above the base layer 108, and the emitter layer 110 may be formed above the intermediate layer. The intermediate layer 202 may provide a more gradual transition between the base and emitter layers 108, 110.

Figure 2B:
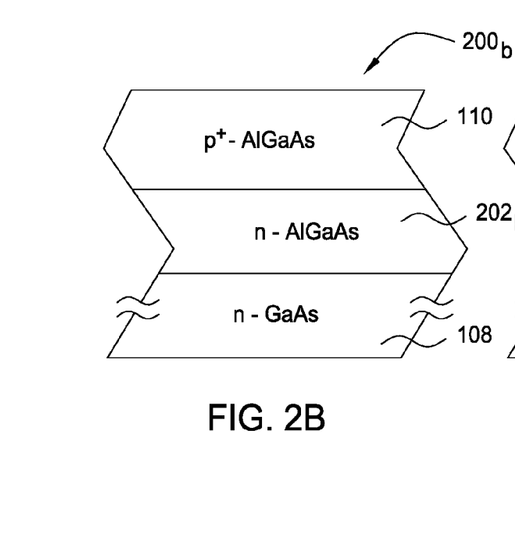
Figure 2C:
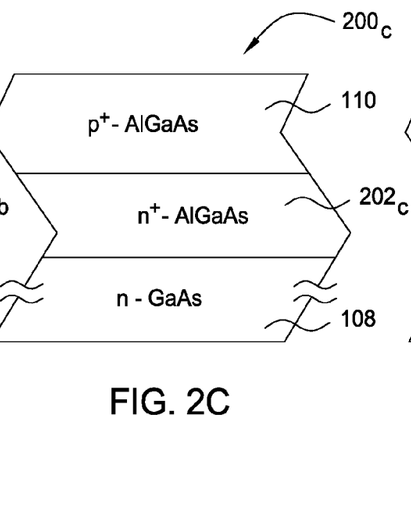
Figure 2D:
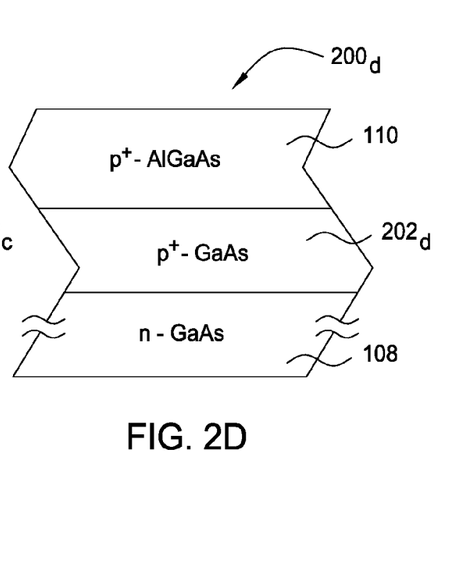

The intermediate layer 202 may be n-doped, heavily n-doped (i.e., n$^+$-doped), or p$^+$-doped. For example, FIG. 2B illustrates an intermediate layer $202_b$ comprising n-AlGaAs. As another example, FIG. 2C depicts an intermediate layer $202_b$ comprising n$^+$-AlGaAs. As yet another example, FIG. 2D portrays an intermediate layer $202_d$ comprising p+-GaAs.

Figure 3A:
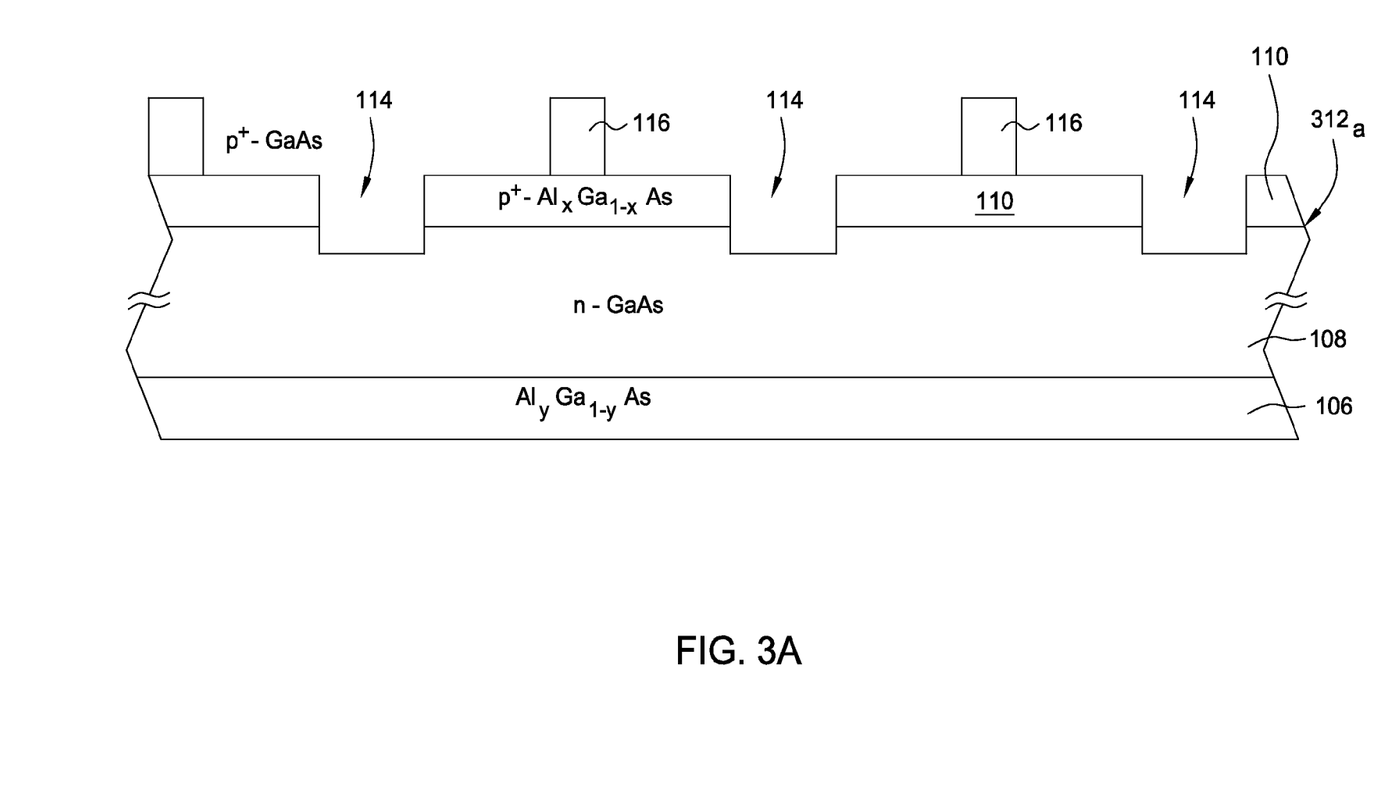
FIGS. 3A and 3B illustrate semiconductor layers for a PV unit with offset p-n layers between the base and emitter layers, in accordance with embodiments of the present invention.
Figure 3B:
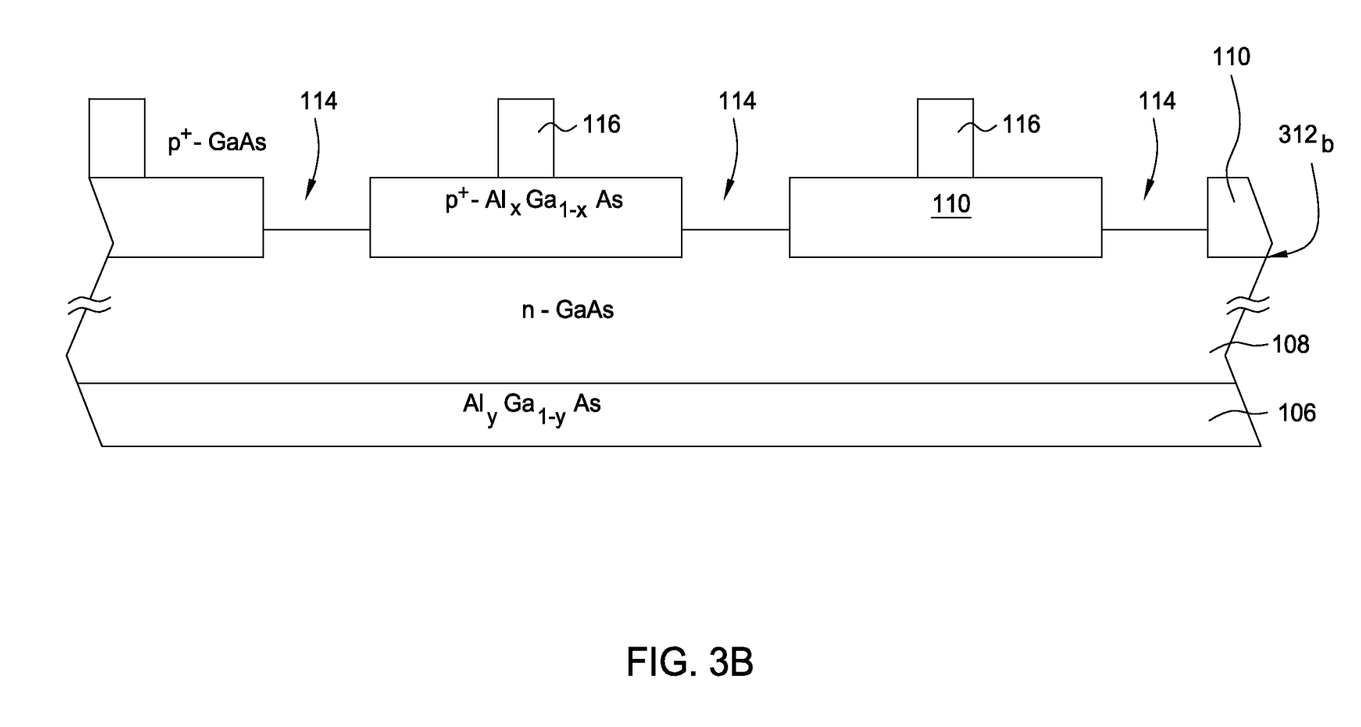

In FIG. 1, the p-n layer 112 between the base layer 108 and the emitter layer 110 is flat and is not exposed in the recesses 114. In other words, the p-n layer 112 of FIG. 1 may be considered as a plane having only two-dimensional geometry. For some embodiments, as shown in FIGS. 3A and 3B, the semiconductor layers for a PV unit may be formed to create an offset p-n layer 312 between the base and emitter layers 108, 110. In other words, an offset p-n layer 312 may be considered to have three-dimensional geometry. An offset p-n layer 312 may be exposed in the recesses 114.

As illustrated in FIG. 3A, an offset p-n layer $312_a$ may be produced by removing semiconductor material all the way through the emitter layer 110 and partially into the base layer 108 when forming the recesses 114 as described above. Another method of forming an offset p-n layer $312_b$, as illustrated in FIG. 3B, may comprise applying a mask to the base layer 108 before forming the emitter layer 110. Semiconductor material may be removed via any suitable technique, such as etching, from a portion of the base layer 108 where the emitter layer is intended to remain (i.e., everywhere except the desired locations of the recesses 114). Once the emitter layer 110 and the recesses 114 are formed in the emitter layer, the resulting offset p-n layer $312_b$ has a greater surface area than a flat p-n layer 112.

Figure 4:
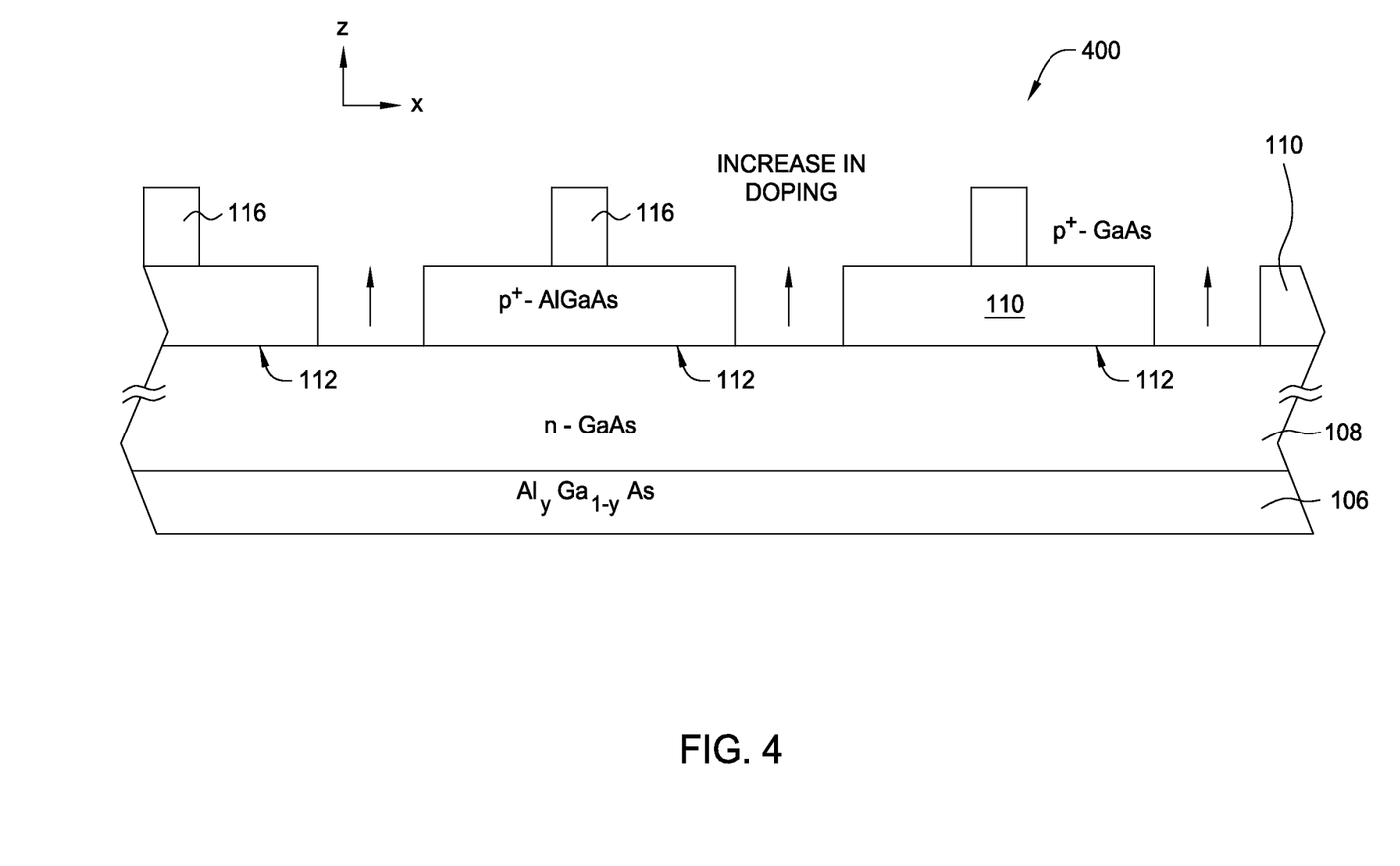
FIG. 4 illustrates semiconductor layers for a PV unit with an emitter layer having a doping profile fine-tuned such that the doping levels increase from the p-n layer to the top of the emitter layer, in accordance with an embodiment of the present invention.

For some embodiments, doping levels may be fine-tuned within a layer of the PV unit during fabrication. For example, FIG. 4 illustrates a PV unit 400 with an emitter layer 110 having a doping profile fine-tuned such that the doping concentration increases from the p-n layer 112 to the top of the emitter layer 110 in the z-direction.

Figure 5:
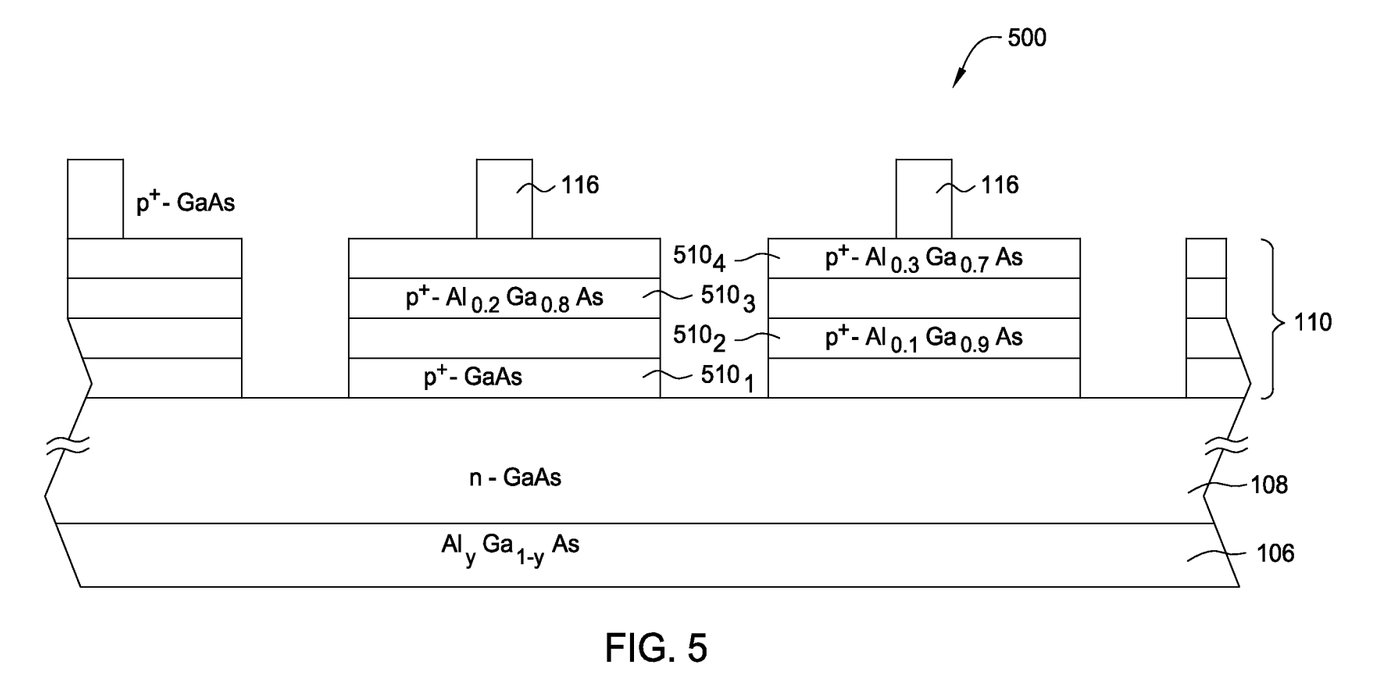
FIG. 5 illustrates semiconductor layers for a PV unit with multiple AlGaAs emitter layers having graded aluminum (Al) levels, in accordance with an embodiment of the present invention.

For some embodiments, the emitter layer 110 may comprise multiple layers, and the multiple layers may comprise different compositions. For example, FIG. 5 illustrates semiconductor layers for a PV unit 500 with multiple $p^+$-AlGaAs emitter layers having graded aluminum (Al) levels (i.e., percentages), in accordance with an embodiment of the present invention. In this example embodiment, a first emitter layer $510_1$ comprising $p^+$-GaAs without any aluminum may be formed above the base layer 108. A second emitter layer $510_2$ comprising $p^+$-$Al_{0.1}Ga_{0.9}As$ may be formed above the first emitter layer $510_1$. Then, a third emitter layer $510_3$ comprising $p^+$-$Al_{0.2}Ga_{0.8}As$ and a fourth emitter layer $510_4$ comprising $p^+$-$Al_{0.3}Ga_{0.7}As$ may be formed above the second emitter layer $510_2$, in turn. Having such graded Al levels may avoid junction barriers.

While the foregoing is directed to embodiments of the invention, other and further embodiments of the invention may be devised without departing from the basic scope thereof, and the scope thereof is determined by the claims that follow.

The invention claimed is:

1. A photovoltaic device, comprising:
 a heterojunction comprising a n-doped GaAs layer directly adjacent to a $p^+$-doped AlGaAs layer; and an interface layer comprising a Group III-V compound semiconductor above the $p^+$-doped AlGaAs layer,
 wherein recesses are formed in the $p^+$-doped AlGaAs layer,
 wherein the $p^+$-doped AlGaAs layer forms an absorber layer having a thickness less than 800 nm such that electric energy is created when photons are absorbed,
 wherein the doping density in the n-doped GaAs layer is lower than in the $p^+$-doped AlGaAs layer such that electrons in the n-doped GaAs layer have a higher mobility than the mobility of holes in the $p^+$-doped AlGaAs layer, and
 wherein the $p^+$-doped AlGaAs layer comprises a plurality of $p^+$-doped AlGaAs layers wherein each of the plurality of $p^+$-doped AlGaAs layer comprises a different percentage of aluminum.

2. The photovoltaic device of claim 1, wherein the n-doped GaAs layer has a thickness in a range from about 300 nm to about 3500 nm.

3. A photovoltaic device, comprising:
 a heterojunction comprising a n-doped GaAs layer directly adjacent to a $p^+$-doped AlGaAs layer; and an interface layer comprising a Group III-V compound semiconductor above the $p^+$-doped AlGaAs layer,
 wherein recesses are formed in the $p^+$-doped AlGaAs layer,
 wherein the $p^+$-doped AlGaAs layer has a doping profile tuned such that doping levels increase from a first side of the $p^+$-doped AlGaAs layer to a second side,
 wherein the doping density in the n-doped GaAs layer is lower than the $p^+$-doped AlGaAs layer such that electrons in the n-doped GaAs layer have a higher mobility than the mobility of holes in the $p^+$-doped AlGaAs layer,
 wherein the $p^+$-doped AlGaAs layer forms an absorber layer and has a thickness less than 800 nm such that electric energy is created when photons are absorbed, and
 wherein the $p^+$-doped AlGaAs layer comprises a plurality $p^+$-doped AlGaAs layers.

4. The photovoltaic device of claim 3, wherein each of the plurality of $p^+$-doped AlGaAs layers comprises a different percentage of aluminum.

5. The photovoltaic device of claim 3, wherein the n-doped GaAs layer has a thickness in a range from about 300 nm to about 3500 nm.

6. The photovoltaic device of claim 3, wherein the n-doped GaAs layer has a doping level of $2 \times 10^{17}$ $cm^{-3}$.

7. The photovoltaic device of claim 3, wherein the $p^+$-doped AlGaAs layer has a doping level of $1 \times 10^{19}$ $cm^{-3}$.

* * * * *